United States Patent
Ji et al.

(10) Patent No.: US 8,583,854 B2
(45) Date of Patent: Nov. 12, 2013

(54) NONVOLATILE STORAGE DEVICE WITH NCQ SUPPORTED AND WRITING METHOD FOR A NONVOLATILE STORAGE DEVICE

(75) Inventors: Yung-Li Ji, Hsinchu (TW); Chin-Nan Yen, Hsinchu (TW); Fu-Ja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 500 days.

(21) Appl. No.: 12/155,410

(22) Filed: Jun. 4, 2008

(65) Prior Publication Data
US 2009/0164698 A1 Jun. 25, 2009

(30) Foreign Application Priority Data
Dec. 24, 2007 (TW) .............................. 96149713 A

(51) Int. Cl.
G11C 16/10 (2006.01)
G06F 12/00 (2006.01)
G06F 3/06 (2006.01)

(52) U.S. Cl.
USPC .................. 711/103; 711/154; 711/E12.008; 710/5; 710/39; 710/74

(58) Field of Classification Search
None
See application file for complete search history.

(56) References Cited

U.S. PATENT DOCUMENTS

| | | | |
|---|---|---|---|
| 5,875,462 A * | 2/1999 | Bauman et al. ............. 711/119 |
| 6,121,974 A * | 9/2000 | Shaw ......................... 345/582 |
| 6,957,294 B1 * | 10/2005 | Saunders et al. ................. 711/4 |
| 7,085,895 B2 * | 8/2006 | Kishi ........................... 711/135 |
| 7,145,805 B2 * | 12/2006 | Ishii et al. ................. 365/185.24 |
| 7,636,814 B1 * | 12/2009 | Karr et al. ...................... 711/143 |
| 8,120,960 B2 * | 2/2012 | Varkony .................... 365/185.16 |
| 2001/0049770 A1 * | 12/2001 | Cai et al. ........................ 711/129 |
| 2004/0034746 A1 * | 2/2004 | Horn et al. .................... 711/141 |
| 2005/0055512 A1 * | 3/2005 | Kishi ............................ 711/135 |
| 2005/0076115 A1 * | 4/2005 | Andrews et al. .............. 709/224 |
| 2005/0193058 A1 * | 9/2005 | Yasuda et al. ................. 711/112 |
| 2006/0120164 A1 * | 6/2006 | Ishii et al. ................. 365/185.24 |
| 2006/0143399 A1 * | 6/2006 | Petev et al. .................... 711/136 |
| 2006/0256611 A1 * | 11/2006 | Bednorz et al. ............... 365/158 |
| 2007/0011360 A1 * | 1/2007 | Chang et al. ...................... 710/5 |
| 2008/0022026 A1 * | 1/2008 | Yang et al. .................... 710/200 |
| 2008/0086585 A1 * | 4/2008 | Fukuda et al. ................ 711/100 |
| 2008/0086600 A1 * | 4/2008 | Qiao ............................ 711/133 |
| 2008/0120463 A1 * | 5/2008 | Ashmore ...................... 711/114 |
| 2008/0263282 A1 * | 10/2008 | Harada et al. ................. 711/129 |
| 2008/0294837 A1 * | 11/2008 | Suda ............................ 711/103 |
| 2008/0301256 A1 * | 12/2008 | McWilliams et al. ........ 709/214 |
| 2009/0055575 A1 * | 2/2009 | Hanhimaki et al. .......... 711/103 |

(Continued)

OTHER PUBLICATIONS

"Serial ATA Native Command Queuing: An Exciting New Performance Feature for Serial ATA." Joint whitepaper by Intel and Seagate, Jul. 2003.*

(Continued)

*Primary Examiner* — Matthew Bradley
*Assistant Examiner* — Daniel Bernard
(74) *Attorney, Agent, or Firm* — Muncy, Geissler, Olds & Lowe, PLLC

(57) ABSTRACT

A nonvolatile storage device buffers multiple write commands and selects one or more therefrom according to a choosing policy to execute in priority, so as to increase the probability of continuously executing write commands corresponding to an identical smallest erasable unit, thereby reducing the frequency of backup, erasing and copyback operations and improving the efficiency of the nonvolatile storage device.

26 Claims, 18 Drawing Sheets

(56) References Cited

U.S. PATENT DOCUMENTS

| | | | |
|---|---|---|---|
| 2009/0150894 A1* | 6/2009 | Huang et al. | 718/104 |
| 2009/0158918 A1* | 6/2009 | Norman | 84/603 |
| 2009/0190402 A1* | 7/2009 | Hsu et al. | 365/185.08 |
| 2010/0293434 A1* | 11/2010 | Bueb et al. | 714/758 |

OTHER PUBLICATIONS

Reisner, Philipp, and Lars Ellenberg. "DRBD v8: Replicated Storage with Shared Disk Semantics." DRBD, Aug. 6, 2007.*

Intel X25-E SATA Solid State Drive. Product Manual. Intel, Jun. 2008-May 2009.*

* cited by examiner

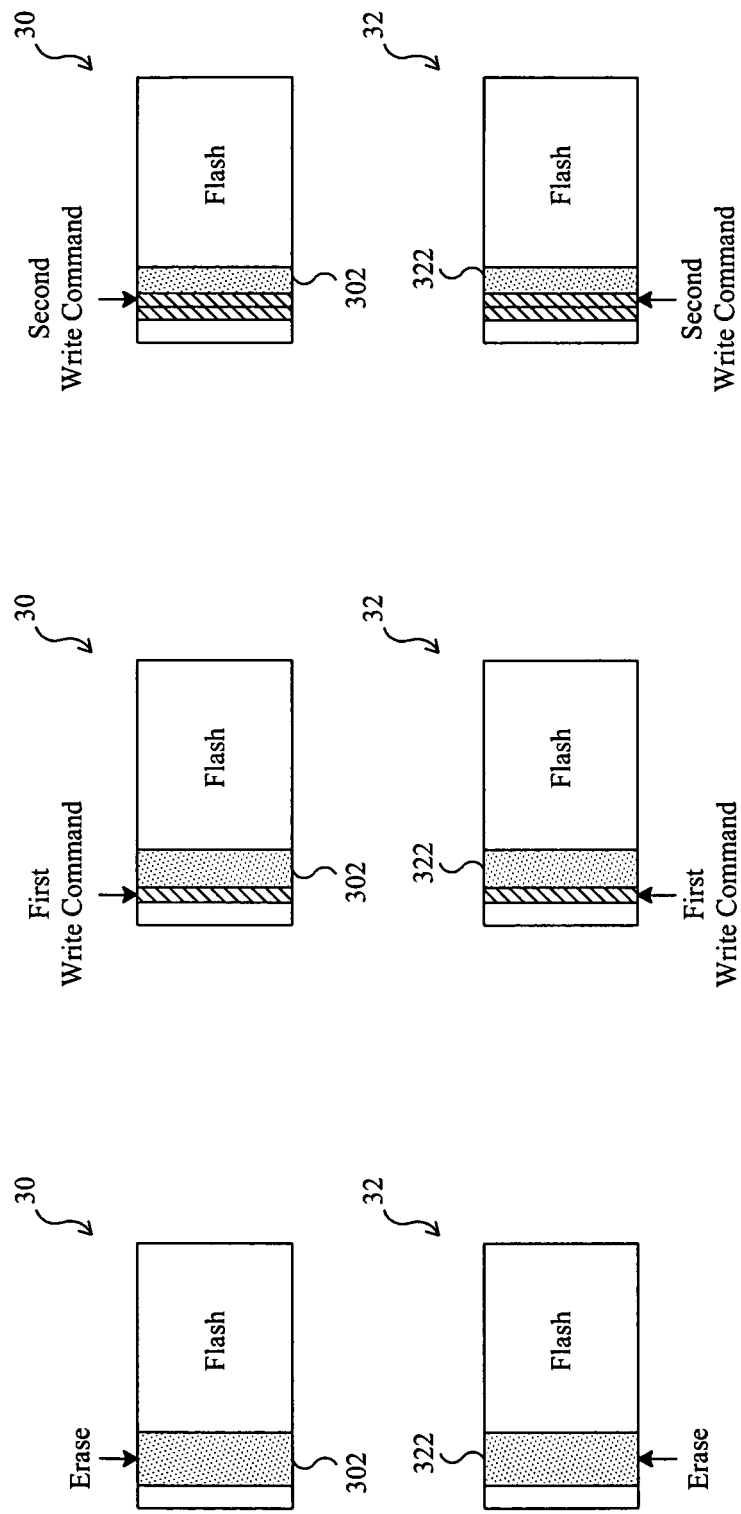

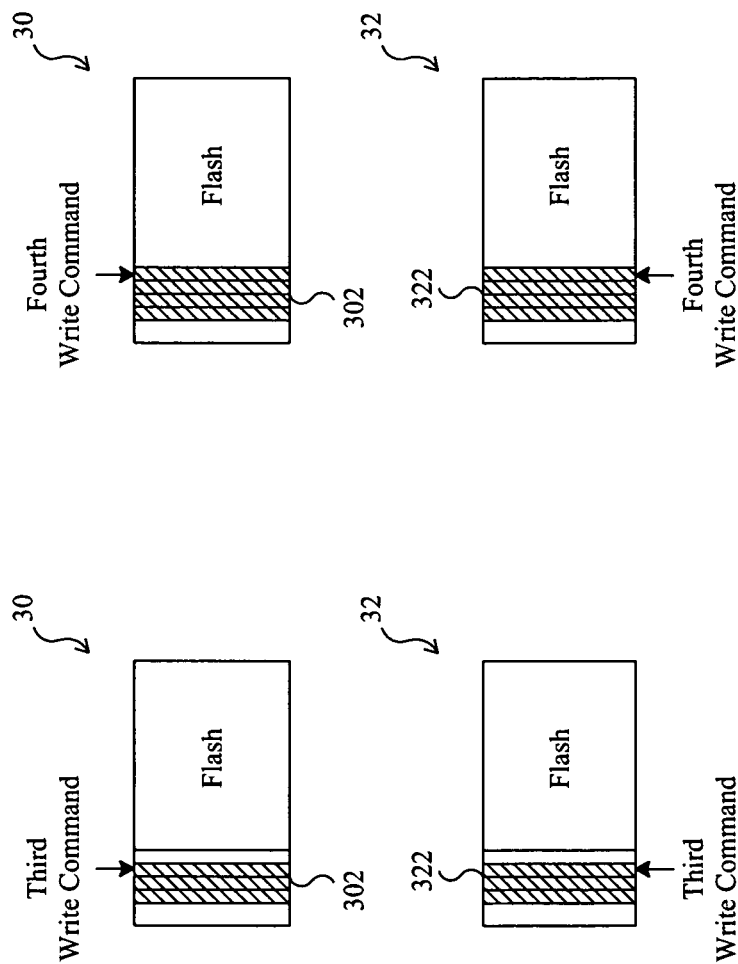

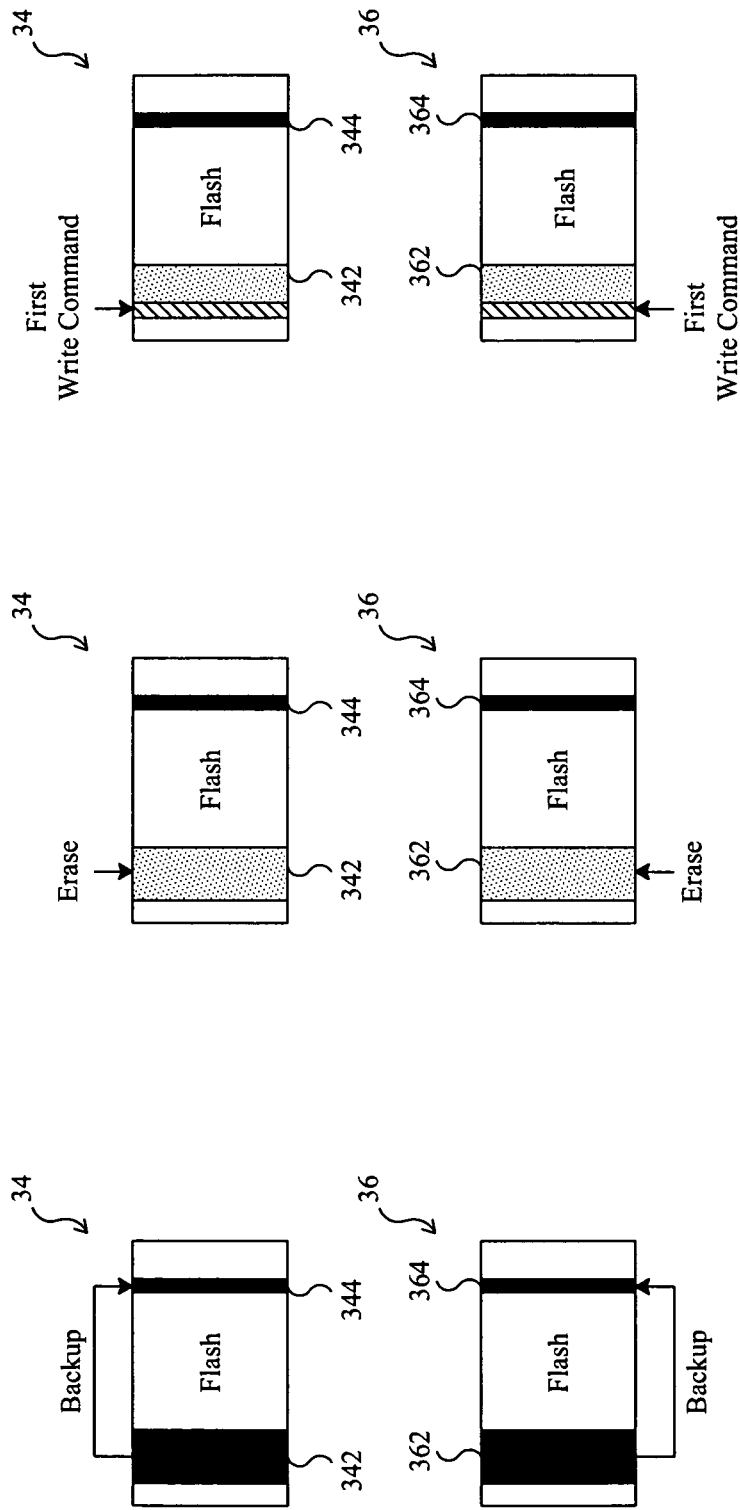

NONVOLATILE STORAGE DEVICE WITH NCQ SUPPORTED AND WRITING METHOD FOR A NONVOLATILE STORAGE DEVICE

FIELD OF THE INVENTION

The present invention is related generally to a nonvolatile storage device and, more particularly, to a SATA solid state disk (SSD).

BACKGROUND OF THE INVENTION

A solid state disk (SSD) has a SATA interface to connect to other electronic devices through SATA bus. The SSD saves data by flash or other nonvolatile memory. In most cases, the Windows file explorer transfers 64 Kbyte data per ATA command and the smallest erasable unit in current flash memory chips for SSD might be 128 Kbytes or larger, so it might need multiple ATA commands to write up to a whole smallest erasable unit. To improve the read/write speed, an SSD simultaneously reads/writes multiple flash memory chips and thereby might erase times of 128 Kbytes each time. FIGS. 1A-1D picture a conventional writing process in a SATA SSD. Assuming that this SSD uses two flash memory chips 10 and 12, each having the smallest erasable unit of 128 Kbytes, when the SSD executes a write command for writing 64 Kbyte data, it will backup the data in the target smallest erasable units 102 and 122 that are not to be changed into some data backup areas 104 and 124 at first, as shown in FIG. 1A, and then erases the smallest erasable units 102 and 122, as shown in FIG. 1B. Now the smallest erasable units 102 and 122 are written with 32 Kbytes therein, respectively, as shown in FIG. 1C. At last, the data in the data backup areas 104 and 124 are copied back to the residue space of the smallest erasable units 102 and 122, as shown in FIG. 1D. For more and detail information about SATA and SATA SSD, readers are referred to "Serial ATA Revision 2.5" and U.S. Pat. No. 7,003,623.

In the conventional operations, however, before completing an ATA command, an SSD does not know anything about the next ATA command. When four write commands, each for writing 64 Kbyte data, are randomly received from a host, the process described through FIGS. 1A-1D will be performed with four times even if the four write commands are writing to non-overlapped spaces of the same smallest erasable unit. In other words, there will be four times of backup operations, four times of erasing operations, four times of writing operations, and four times of copyback operations in this situation. FIG. 2 shows an executive sequence of multiple write commands in a conventional SATA SSD, in which a flash memory chip 14 has two smallest erasable units Block 0 and Block 1. When receiving three write commands, the SATA SSD will execute these commands according to the sequence that the commands are received. At first, the command 1 is executed with the process shown in FIGS. 1A-1D to write data into the smallest erasable unit Block 0. Then, the command 2 is executed with the process shown in FIGS. 1A-1D to write data into the smallest erasable unit Block 1. Finally, the command 3 is executed with the process shown in FIGS. 1A-1D to write data into the smallest erasable unit Block 0. Although the command 1 and the command 3 are both executed to write to the smallest erasable unit Block 0, the process shown in FIGS. 1A-1D has to be performed twice. Such manipulation is less efficient and will shorten the lifetime of the flash memory chips due to repeated erasing and writing operations.

FIGS. 3A-3C picture another conventional writing process in a SATA SSD. Assuming that this SSD uses two flash memory chips 16 and 18, each having the smallest erasable unit of 128 Kbytes, when the SSD executes a write command for writing 64 Kbyte data, it will first ensure that unused smallest erasable units 162 and 182 have been erased, as shown in FIG. 3A. Then, the smallest erasable units 162 and 182 are written with 32 Kbytes therein, respectively, as shown in FIG. 3B. At last, data in some original data areas 164 and 184 are copied to the residue space of the smallest erasable units 162 and 182, and the original data areas 164 and 184 are marked to be unused smallest erasable units. This approach would eliminate one time of backup per each writing process, but the process shown in FIGS. 3A-3C is still repeated each time to execute a write command and causes poor efficiency.

Therefore, it is desired a more efficient nonvolatile storage device and writing method for a nonvolatile storage device.

SUMMARY OF THE INVENTION

An object of the present invention is to provide a nonvolatile storage device and writing method for a nonvolatile storage device with NCQ supported.

Another object of the present invention is to improve the write speed of a nonvolatile storage device and writing method for a nonvolatile storage device.

Yet another object of the present invention is directed to extend the lifetime of a nonvolatile storage device.

Still another object of the present invention is to provide a learning mechanism for optimizing the efficiency of a nonvolatile storage device.

According to the present invention, a SATA nonvolatile storage device comprises a SATA interface to receive and buffer NCQ commands, a record unit to record write commands in the NCQ commands and an information corresponding thereto, and a choosing unit to requeue the write commands according to the information and a default choosing policy so as to increase the probability of continuously executing write commands corresponding to a same smallest erasable unit. The choosing unit includes multiple choosing policies and selects one therefrom as a default choosing policy according to previous experience. The choosing unit further includes a learning mechanism to determine a best choosing policy adaptive to various operational systems and applications.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which:

FIGS. 6A-6E picture a writing process for continuously executing four write commands in a SATA SSD;

FIGS. 7A-7F picture a writing process for continuously executing three write commands in a SATA SSD;

DETAIL DESCRIPTION OF THE INVENTION

Figure 1:
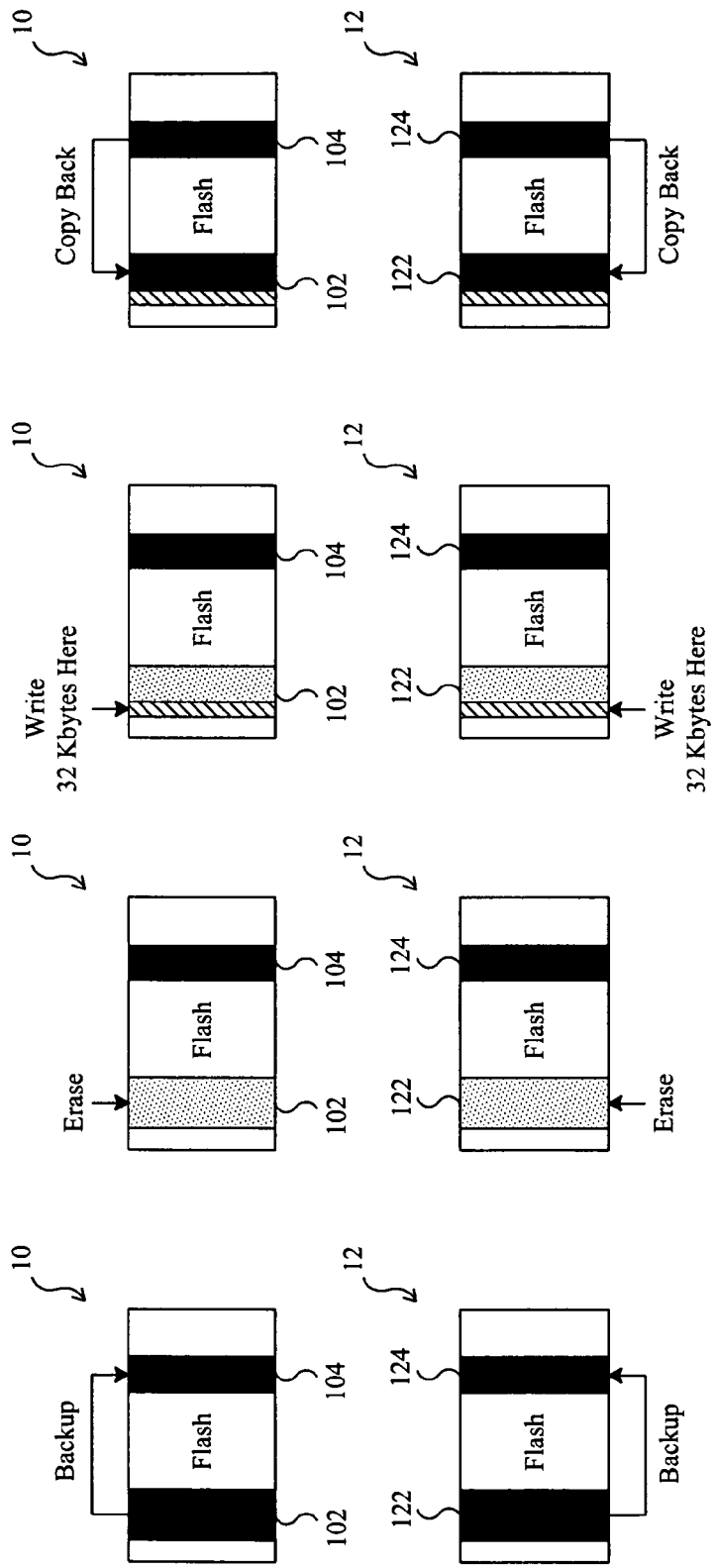
FIGS. 1A-1D picture a conventional writing process in a SATA SSD.
Figure 2:
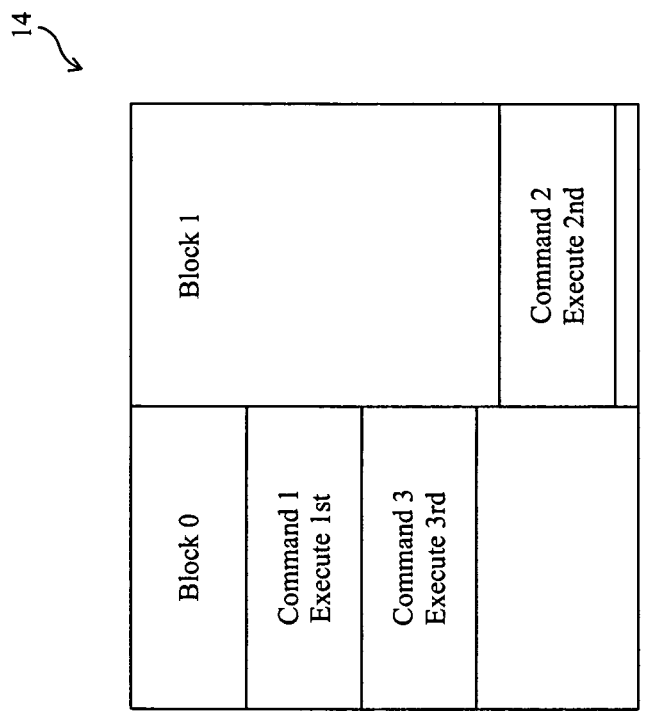
FIG. 2 shows an executive sequence of multiple write commands in a conventional SATA SSD.
Figures 3A, 3B, 3C:
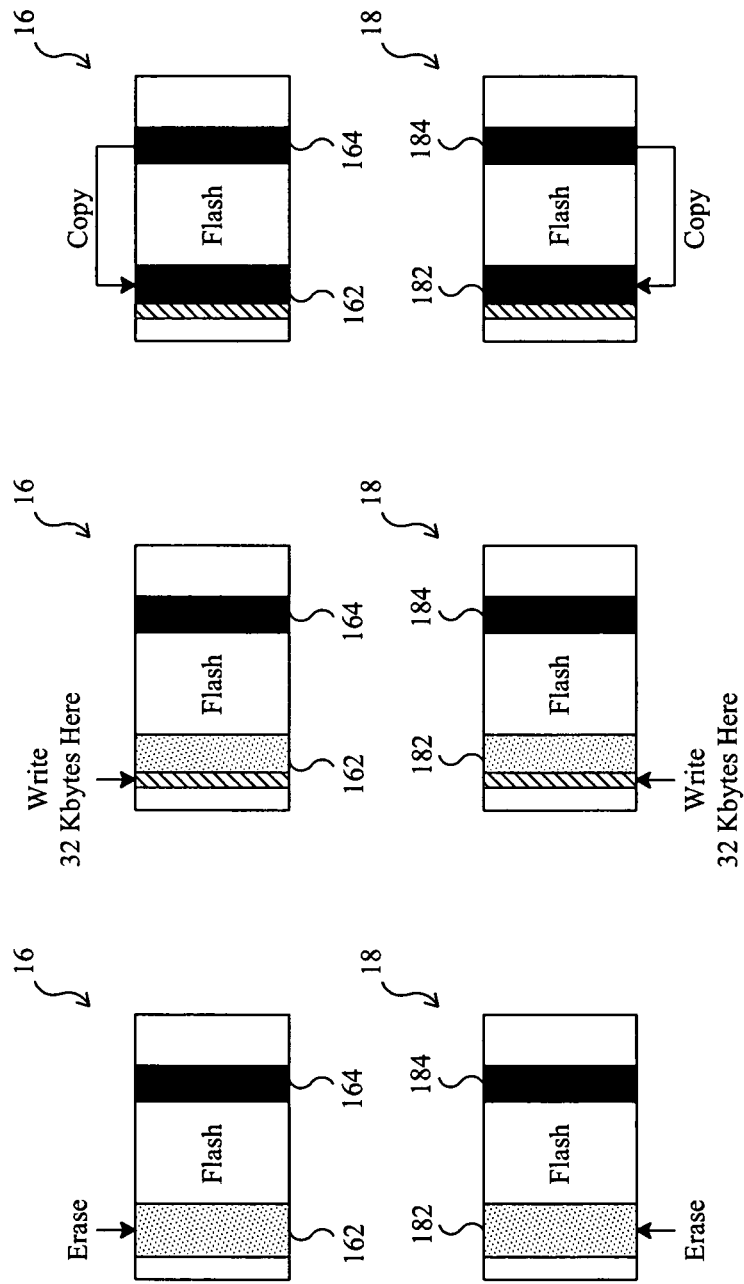
FIGS. 3A-3C picture another conventional writing process in a SATA SSD.
Figure 4:
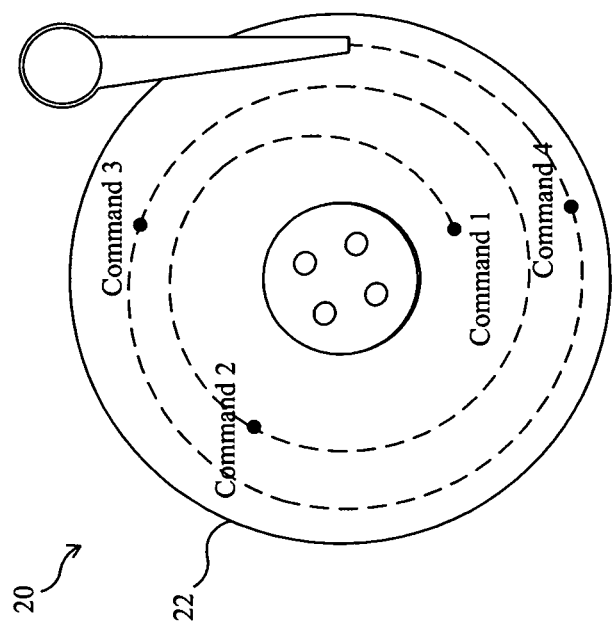
FIG. 4 depicts a writing sequence in a conventional hard disk.
Figure 5:
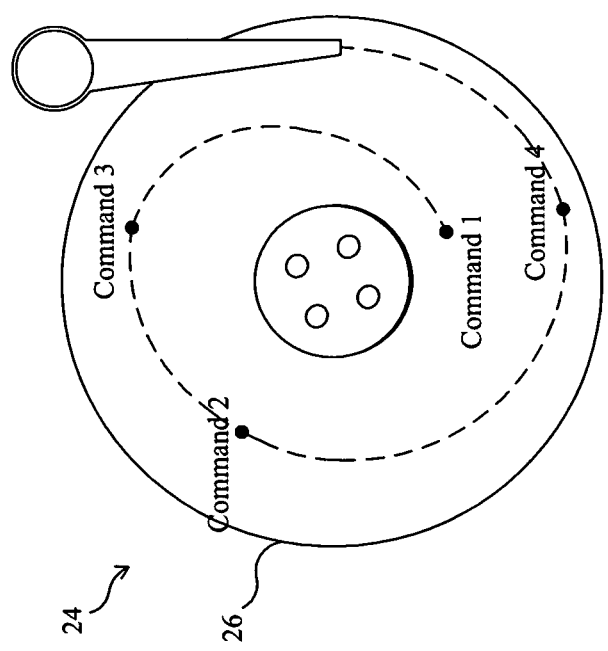
FIG. 5 depicts a writing sequence in a conventional hard disk with NCQ supported.

FIG. 4 depicts a writing sequence in a conventional hard disk. When receiving four write commands, a conventional hard disk 20 will sequentially execute them to write data on the disk platter 22 according to the sequence that the commands are received, as shown in FIG. 4. However, the most efficient executive manner of the disk is to execute the commands in sequence along the rotating direction of the disk platter 22 so as to complete the commands with the least rotations. Therefore, a native command queuing (NCQ) technology has been proposed for requeuing multiple commands in a new executive sequence, after the commands have been received but before being put into execution. FIG. 5 depicts a writing sequence in a conventional hard disk with NCQ supported. When receiving four write commands, the hard disk 24 first identifies the address and data length for each of the commands to write therewith before executing the commands, and then requeues the commands in another executive sequence along the rotating direction of the disk platter 26. After such requeuing, as shown in FIG. 5, the hard disk 24 will execute the command 1 first, then execute the command 3 before executing the command 2, and at last the command 4. Comparing FIGS. 4 and 5, the disk platter 22 of the hard disk 20 without NCQ supported rotates for approximately two circles to complete all of the four commands, while the disk platter 26 of the hard disk 24 with NCQ supported can complete the same commands in merely one circle. Namely, the hard disk 24 with NCQ supported is more efficient than the hard disk 20. For more details about NCQ for hard disk, readers may refer to U.S. Pat. No. 6,917,992.

Similarly, if a SATA nonvolatile storage device is NCQ supported, after receiving less than thirty-two write commands and before executing them, it may identify the address and data length for each of the commands to write therewith, so as to analyze the commands for enhancement of the overall efficiency first, and thereby determine an executive sequence for them. For a nonvolatile storage device, one of the most efficient write methods is to continuously execute the write commands that are to write data to an identical smallest erasable unit. FIGS. 6A-6E picture a writing process for continuously executing four write commands in a SATA SSD, in which flash memory chips 30 and 32 have smallest erasable units 302 and 322 of 128 Kbytes, respectively. Assuming that this SSD with NCQ supported randomly receives four write commands, each for writing 64 Kbyte data, to write the non-overlapped space of an identical smallest erasable unit, it may requeue the four write commands to be continuously executed. Since the total data to be written by these four write commands is large enough to fully occupy the smallest erasable units 302 and 332, the SSD can directly erase the smallest erasable units 302 and 332 in the writing process, without backup and copyback operations, as shown in FIG. 6A. Then, the four write commands are sequentially executed to write data into the smallest erasable units 302 and 332 of the flash memory chips 30 and 32, as shown in FIGS. 6B-6E. This fully writing into a smallest erasable unit will have the maximum efficiency. As compared with a SATA SSD without NCQ supported, such approach eliminates four times of backup operations, three times of erasing operations, and four times of copyback operations.

Figure 7F:
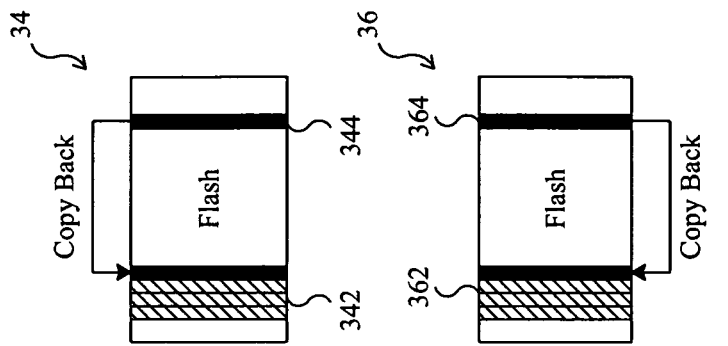
Figure 7E:
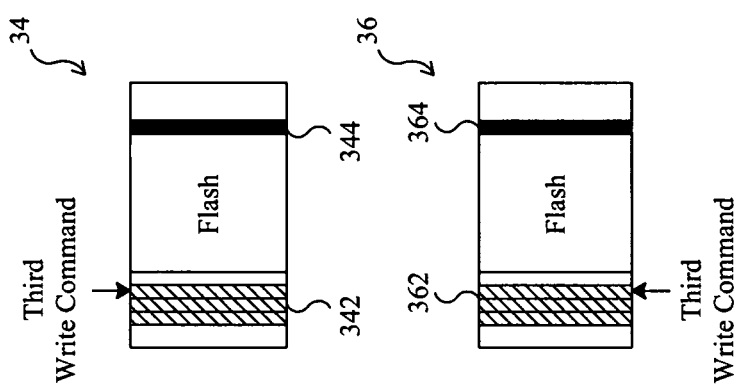
Figure 7D:
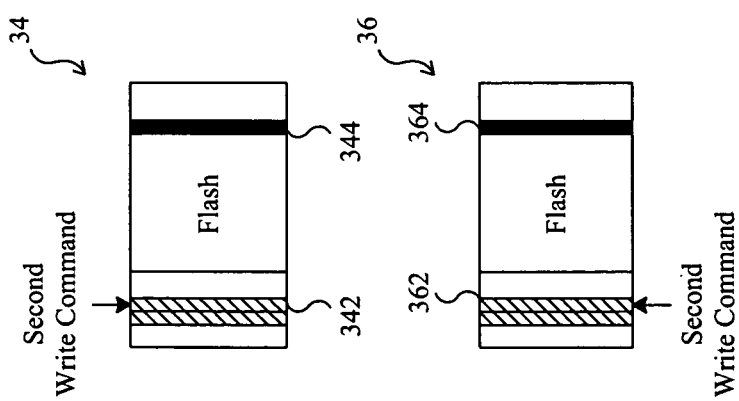

FIGS. 7A-7F picture a writing process for continuously executing three write commands in a SATA SSD, in which flash memory chips 34 and 36 have smallest erasable units 342 and 362 of 128 Kbytes, respectively. Assuming that the SATA SSD with NCQ supported randomly receives the three write commands, each for writing 64 Kbyte data, to write to an identical smallest erasable unit, it may re-queue the three write commands to be continuously executed. At first, data in the target smallest erasable units 342 and 362 that are not to be changed will be backed up to data backup areas 344 and 364, as shown in FIG. 7A, and then the smallest erasable units 342 and 362 are erased, as shown in FIG. 7B. Afterward, the SSD executes the three write commands in sequence to write data into the smallest erasable units 342 and 362, as shown in FIGS. 7C-7E. At last, the data in the data backup areas 344 and 364 are copied back to fill into the residue space of the smallest erasable units 342 and 362, as shown in FIG. 7F. As compared with a conventional SATA SSD without NCQ supported, the embodiment shown in FIGS. 7A-7F saves two times of backup operations, two times of erasing operations, and two times of copyback operations. As described previously, continuously executing multiple write commands to write to an identical smallest erasable unit can reduce the counts of backup, erasing and copyback operations, and thereby improve the overall efficiency and extend the lifetime of a nonvolatile storage device.

Figure 8:
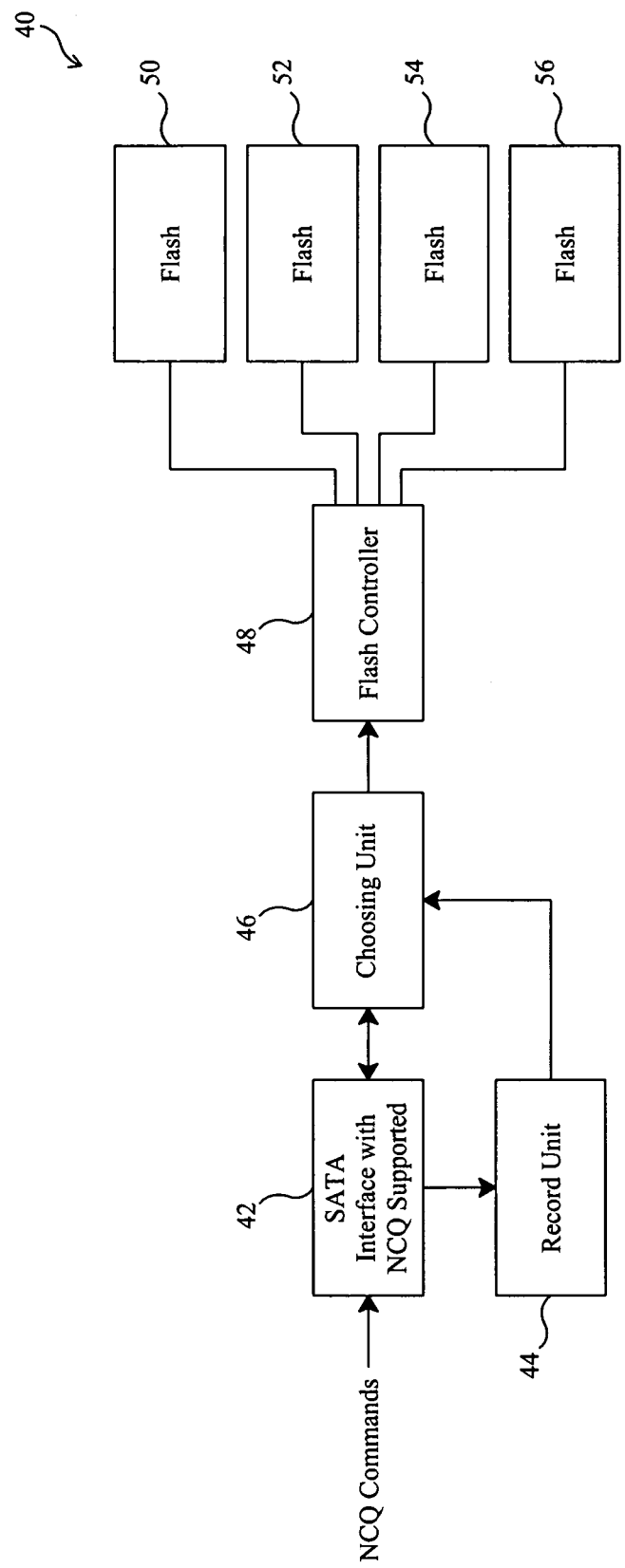
FIG. 8 is a block diagram of a SATA nonvolatile storage device with NCQ supported.

FIG. 8 is a block diagram of a SATA nonvolatile storage device 40 with NCQ supported, which comprises flash memory chips 50, 52, 54 and 56, each having several smallest erasable units thereof, and a SATA interface 42 with NCQ supported to receive NCQ commands, each including a write command thereof, from a host. A record unit 44 is connected to the SATA interface 42 to record each write command received by the SATA interface 42 and the information thereof, where the information may include received sequence, corresponding smallest erasable units of the write command, and logical block address (LBA) the write command to write thereto. The record unit 44 has memory chips for recording the information of the write commands. A choosing unit 46 is connected to the SATA interface 42 and the record unit 44, to select the write commands buffered in the SATA interface 42 according to the information provided by the record unit 44 and a default choosing policy, and to transfer the write commands to a flash controller 48 that is connected to the flash memory chips 50-56. The flash controller 48 executes the write commands come from the choosing unit 46 to write data into the flash memory chips 50, 52, 54 and 56. The choosing unit 46 will requeue the write commands to determine an executive sequence, such that the write commands corresponding to an identical smallest erasable unit are continuously executed. The record unit 44 and the choosing unit 46 may be implemented by software or hardware approaches.

Figure 9:
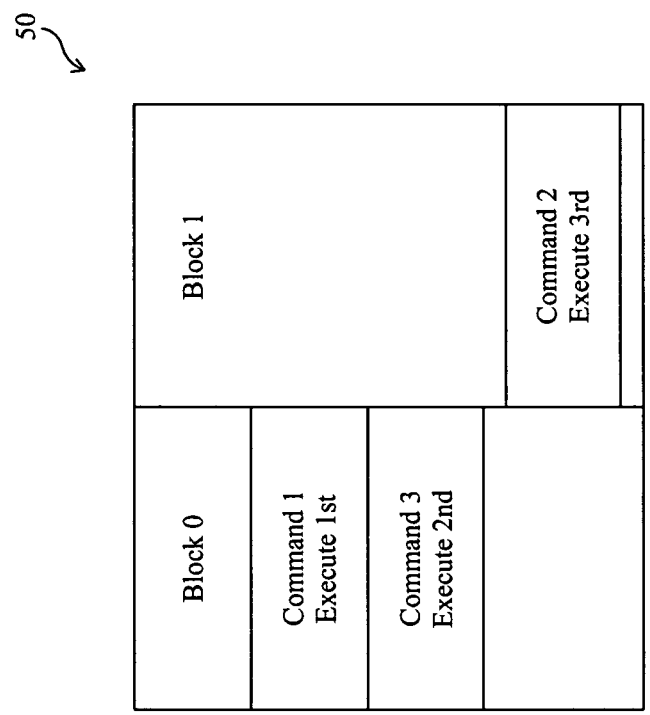
FIG. 9 is an embodiment showing that the nonvolatile storage device of FIG. 8 requeues three write commands in an efficient executive sequence.

FIG. 9 is an embodiment showing that the nonvolatile storage device 40 of FIG. 8 requeues three write commands in an efficient executive sequence, in which a flash memory 50 has smallest erasable units Block 0 and Block 1. When receiving three write commands, the choosing unit 46 identifies from the information provided by the record unit 44 first, that the command 1 and the command 3 are both to write to the smallest erasable unit Block 0, and therefore requeues the three commands in an executive sequence that the command 1 and the command 3 will be continuously executed. As shown in FIG. 9, the command 1 is executed first to write data into the smallest erasable unit Block 0, the command 3 is executed in the second order to write data into the smallest erasable unit Block 0, and the command 2 is executed at last to write data into the smallest erasable unit Block 1. Moreover, when receiving NCQ reading commands, the nonvolatile storage device 40 may also requeue the commands in a similar manner that the embodiment of FIG. 9 shows, so as to continuously read data from an identical smallest erasable unit and thereby to slightly speed up the data reading by saving some operations.

Figure 10:
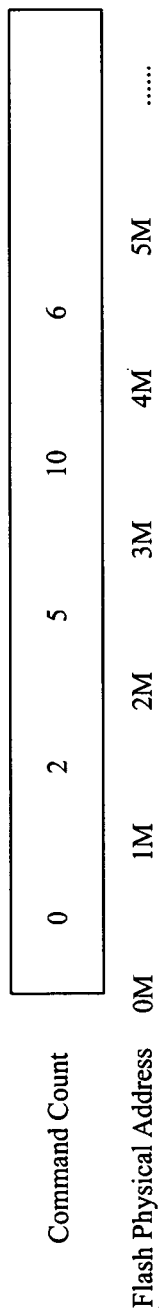
FIG. 10 shows a distribution of twenty-three write commands over the smallest erasable units of a nonvolatile storage device.

In the case that each of the flash memory chips 50, 52, 54 and 56 in the nonvolatile storage device 40 has the smallest erasable unit of 256 Kbytes, the smallest erasable unit of the nonvolatile storage device 40 will be 1 Mbytes (256 Kbytes× 4). For the write command to write data having the data length of 64 Kbytes, there will be up to sixteen write commands to fully occupy a smallest erasable unit of the nonvolatile storage device 40. If the nonvolatile storage device 40 receives twenty-three write commands, each for writing 64 Kbytes, the record unit 44 will record these twenty-three outstanding write commands and information of the directly or indirectly corresponding smallest erasable units, where each of the smallest erasable units has a respective flash physical address. FIG. 10 shows a distribution of twenty-three write commands over the smallest erasable units of a nonvolatile storage device, in which there is no write command for writing to the smallest erasable unit at the flash physical address of 0M to 1M-1, two write commands are for writing to the smallest erasable unit at the flash physical address of 1M to 2M-1, five write commands are for writing to the smallest erasable unit at the flash physical address of 2M to 3M-1, ten write commands are for writing to the smallest erasable unit at the flash physical address of 3M to 4M-1, and six write commands are for writing to the smallest erasable unit at the flash physical address of 4M to 5M-1. With the help of this distribution, the choosing unit 46 may select one from the twenty-three write commands as the first one to be executed according to a default choosing policy, and then continuously execute all the others corresponding to the identical smallest erasable unit of the first write command. The choosing policy could be prepared by the system designer of the nonvolatile storage device 40, and five examples are provided for illustration in the following.

(1) Largest Fit Policy

The smallest erasable unit corresponding to the largest number of write commands or the smallest erasable unit that can be entirely occupied has the highest priority in order to process as many as possible write commands after a smallest erasable unit is erased. For example, in FIG. 10, the smallest erasable unit corresponding to the largest number of write commands is at the flash physical address of 3M to 4M-1, and thus the ten write commands corresponding thereto are continuously executed at first. If more write commands corresponding to this smallest erasable unit are received during executing these ten write commands, the newly received write commands may be also executed in priority to reduce the probability of receiving more write commands corresponding to this smallest erasable unit as far as possible, and therefore reduce the probability of needing another smallest erasable unit for repeating the process of FIGS. 1A-1D.

(2) Smallest Fit Policy

The smallest erasable unit corresponding to the smallest number of write commands has the highest priority in order to spare more space, so that the smallest erasable unit corresponding to the largest number of write commands can continuously receive more write commands or the write commands sufficient to fully occupy therein. For example, in FIG. 10, the smallest erasable unit corresponding to the smallest number of write commands is at the flash physical address of 1M to 2M-1, and thus the two write commands corresponding thereto are continuously executed at first. If more write commands corresponding to this same smallest erasable unit are received during executing these two write commands, the newly received write commands may be also executed in priority to reduce the probability of receiving more write commands corresponding to this smallest erasable unit as far as possible and therefore reduce the probability of needing another smallest erasable unit for repeating the process of FIGS. 1A-1D.

(3) Latest Fit Policy

The smallest erasable unit corresponding to the latest write command has the highest priority in order to spare more space, so that the other smallest erasable units can continuously receive more write commands or the write commands sufficient to fully occupy therein. For example, in FIG. 10, the smallest erasable unit corresponding to the latest write command is at the physical address of 2M to 3M-1, and thus the five write commands corresponding to thereto are continuously executed at first. If more write commands corresponding to this smallest erasable unit are received during executing these five write commands, the newly received write commands may be also executed in priority to reduce the probability of receiving more write commands corresponding to this smallest erasable unit as far as possible and therefore reduce the probability of needing another smallest erasable unit for repeating the process of FIGS. 1A-1D.

(4) Earliest Fit Policy

The smallest erasable unit corresponding to the earliest write command has the highest priority in order to spare more space, so that the other smallest erasable units can continuously receive more write commands or the write commands sufficient to fully occupy therein. For example, in FIG. 10, the smallest erasable unit corresponding to the earliest write command is at the physical address of 4M to 5M-1, and thus the six write commands corresponding to this smallest erasable unit are continuously executed at first. If more write commands corresponding to this smallest erasable unit are received during executing these six write commands, the newly write commands may be also executed in priority to reduce the probability of receiving more write commands corresponding to this smallest erasable unit as far as possible and therefore reduce the probability of needing another smallest erasable unit for repeating the process of FIGS. 1A-1D.

(5) Weight Sort Policy

Each of the twenty-three write commands is given a weighting coefficient according to its order in the received sequence. For example, the n-th write command in the received sequence is given a weighting coefficient of $W_n$. Then, the weighting coefficients of all the write commands belonging to an identical smallest erasable unit are summed to obtain a sum value. After all the smallest erasable units are so evaluated through this process, the smallest erasable unit having the extreme sum value is selected and the write commands corresponding to this smallest erasable unit are executed at first.

However, the commands issued from various applications running on the host are diverse and unexpectable, and furthermore, different flash memory chips and different hosts may operate with different speeds. Thus, none of the above five exemplatory policies can ensure the optimization in building a SATA SSD for general purpose. Therefore, multiple choosing policy may be designed in the choosing unit 46 and a learning mechanism is defined to compile statistics of a certain amount of previously received write commands to analyze the respective correspondence between the write commands and the smallest erasable units. Then each of the choosing policies is tested to determine which one is the best policy. This best policy will be used to process the write commands thereafter and is reexamined after processing a certain amount of write commands to evaluate whether it is to be replaced by another policy.

Figure 11:
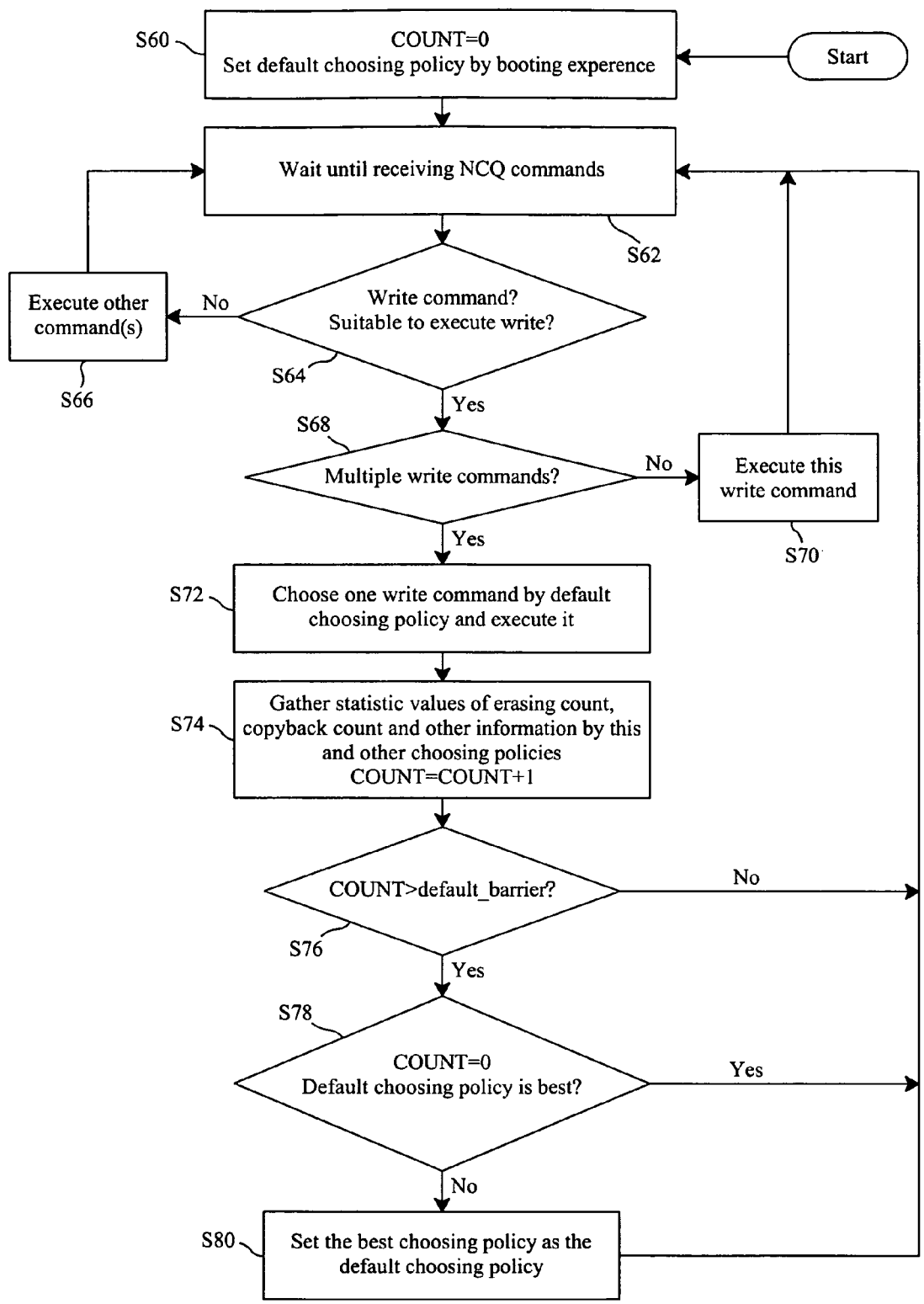
FIG. 11 is a flowchart of a learning mechanism according to the present invention.

FIG. 11 is a flowchart of a learning mechanism according to the present invention. Referring to FIGS. 8 and 11, after the nonvolatile storage device 40 starts up, the choosing unit 46 sets a choosing policy according to booting experience in step S60. In this step, a counting value COUNT for determining whether to conduct a reexamination is set with zero. Then, in step S62, the device 40 waits until the SATA interface 42 receives a NCQ command. This first NCQ command is checked in step S64, to decide whether it is a write command and whether the device 40 is suitable to execute a writing operation now. If the NCQ command is a write command, the record unit 44 records the information of the write command. If it is not suitable to execute the writing operation at present, step S66 will be performed to execute other command ahead, and then it will return to the step S62. If it is suitable to execute the writing operation at present, it is further to check whether multiple write commands are received in step S68. If only one write command is received, this write command is executed directly in step S70, and then it will return to the step S62. If multiple write commands are received, one of them is selected according to the default choosing policy and then executed in step S72. After all the write commands are executed, in step S74, the device 40 gathers the statistic values of flash erasing, copyback count and other information by this choosing policy and other choosing policies, and the counting value COUNT is added by 1. Then the counting value COUNT is checked if it is greater than a preset value default_barrier in step S76. If the counting value COUNT is not greater than default_barrier, the process goes back to the step S62; otherwise, in step S78, the counting value COUNT is returned to zero, and based on the statistic values the default choosing policy is evaluated if it is better than the other choosing policies. If the default choosing policy is indeed better than the other choosing policies, the process returns to the step S62; otherwise, the best one among the choosing policies is set as the default choosing policy in step S80. Then, the process also goes back to the step S62. In addition, when the SATA nonvolatile storage device 40 receives a rebooting command or a start-up signal and therefore identifies that booting is to be conducted, it may store the best choosing policy learned through the above process in this booting, so that the learned best choosing policy can be used in the next booting to improve the booting speed.

The learning mechanism proposed by the present invention is feasible to adjust and learn booting processes for various operational systems installed with various applications to optimize the writing speed of the SATA nonvolatile storage device. Also, after various benchmarks are executed or after a certain amount of input/output (I/O) operations for accessing some applications are conducted, the learning mechanism can optimize future I/O operations. Besides, as to write SATA nonvolatile memory chips, the frequencies of erasing and writing the flash memory chips can be reduced without a great number of random access memories (RAMs) for storing data, thereby improving the efficiency and lifetime while maintaining the overall reliability of writing operations.

Figure 12:
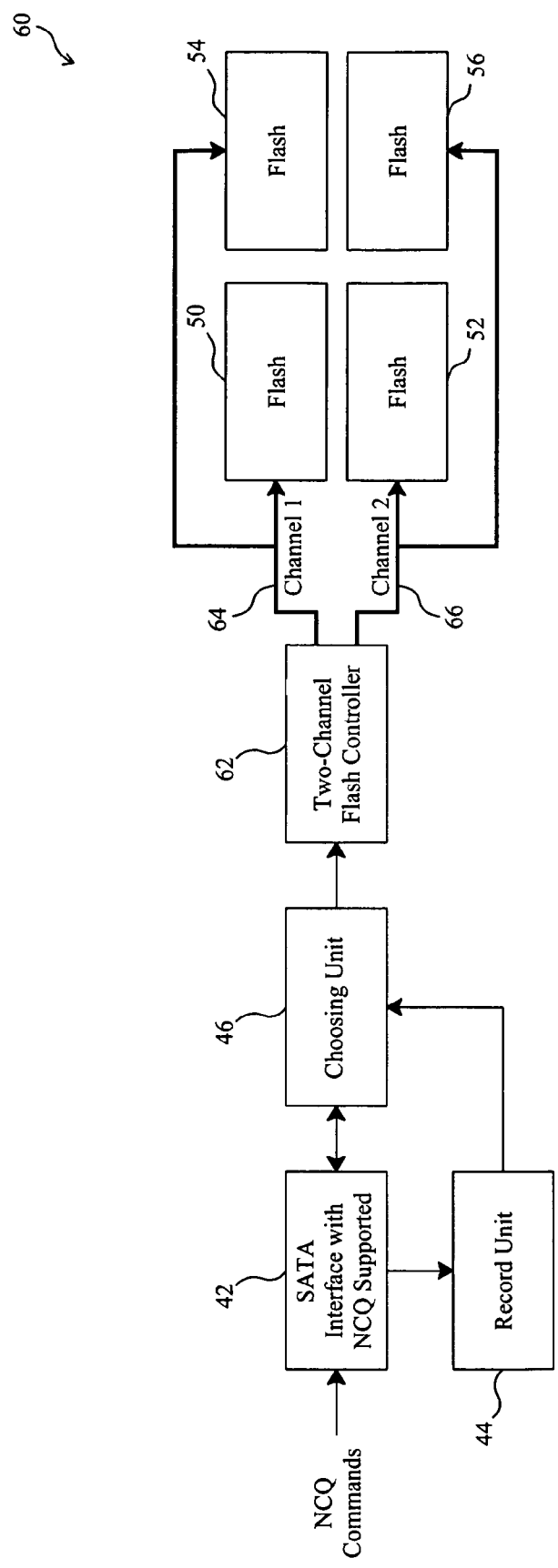
FIG. 12 is a block diagram of a SATA nonvolatile storage device with NCQ supported.

FIG. 12 is a block diagram of a SATA nonvolatile storage device 60 with NCQ supported, which comprises a SATA interface 42 with NCQ supported, a record unit 44, a choosing unit 46, flash memory chips 50, 52, 54 and 56, and a two-channel flash controller 62. To speed up the reading/writing operations, the SATA nonvolatile storage device 60 may be designed to be capable of operating multiple flash memory chips simultaneously. For instance, a data transmission bus 64 is provided between the two-channel flash controller 62 and the flash memory chip 50, referred to as channel 1, and another data transmission bus 66 is provided between the two-channel flash controller 62 and the flash memory chip 52, referred to as channel 2. The data transmission buses 64 and 66 can cooperate to improve the overall efficiency. In addition, one data transmission bus may be connected to multiple flash memory chips. For example, as shown in FIG. 12, the data transmission bus 64 is connected to the flash memory chips 50 and 54, and the data transmission bus 66 is connected to the flash memory chips 52 and 56. In this configuration, after the two-channel flash controller 62 transmits data to the flash memory chips 50 and 52 through the data transmission buses 64 and 66 (about 100 μs for completing the data transmission of a flash memory chip), when the flash memory chips 50 and 52 receive the data and are busy (about 200-800 μs for the busy time of a flash memory chip), the two-channel flash controller 62 can transmits data to the other flash memory chips 54 and 56 through the data transmission buses 64 and 66.

Figure 13:
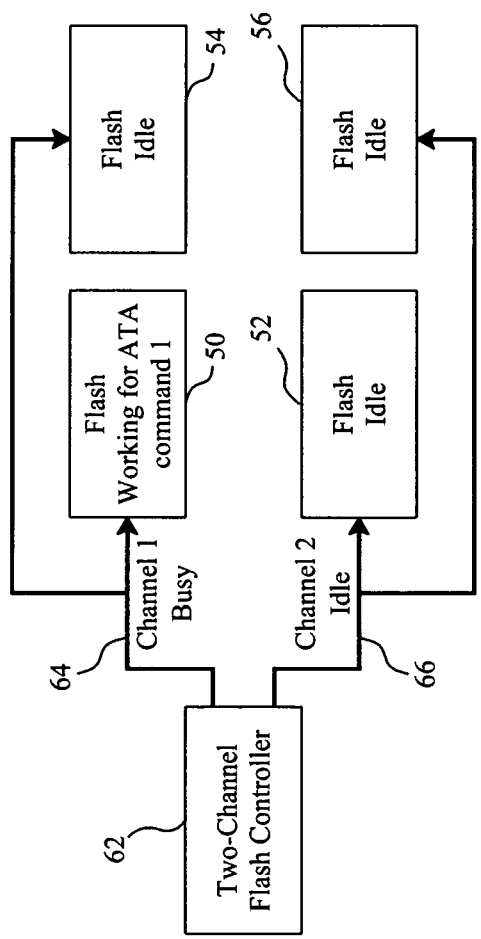
FIG. 13 shows a situation that only one flash memory chip and one channel are working.
Figure 14:
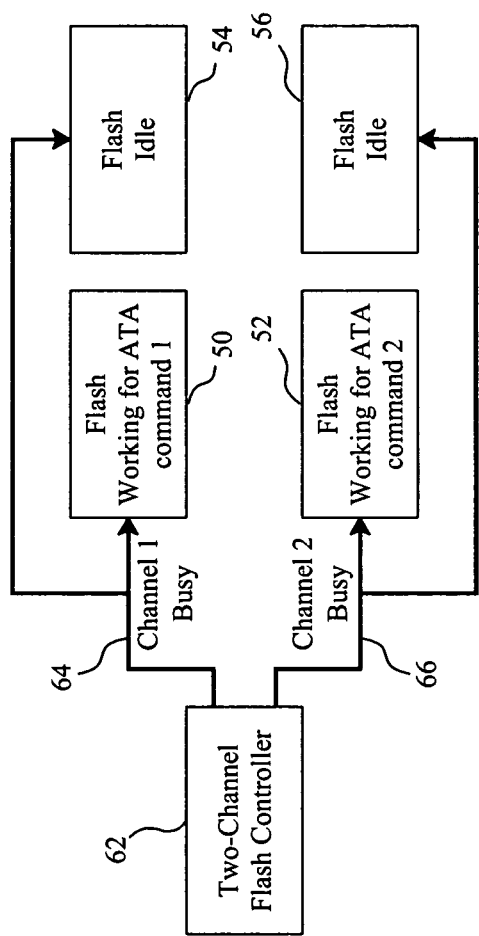
FIG. 14 shows a situation that when a channel is still engaged in data transmission, the other channel is active to transmit data.
Figure 15:
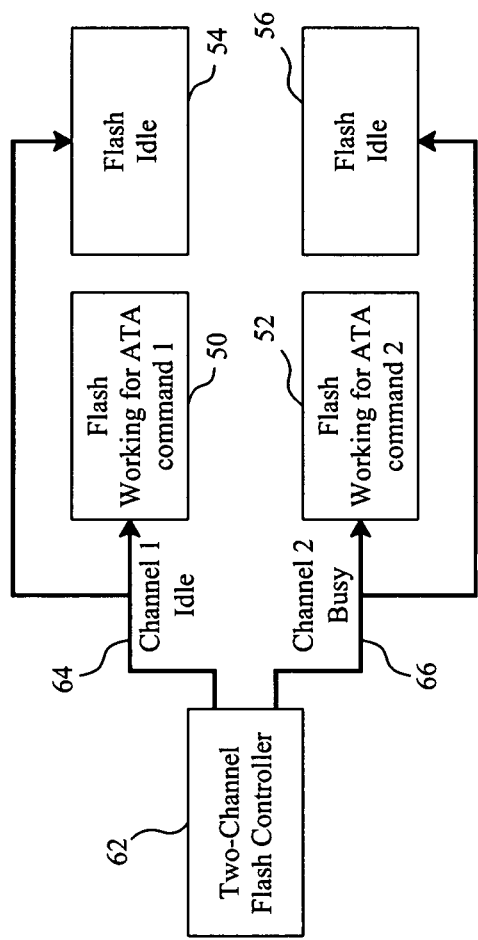
FIG. 15 shows a situation that when a flash memory chip on a channel is busy, the other channel is active to transmit data.
Figure 16:
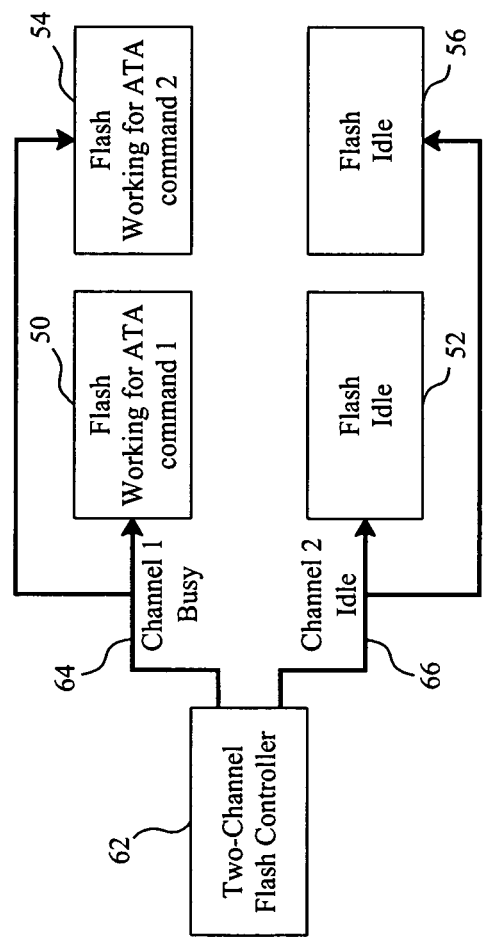
FIG. 16 shows a situation that when a flash memory chip on a channel is busy, the same channel is active to transmit data to the other flash memory chip.

When receiving a command for reading/writing a small data volume, for example an ATA command for reading/writing only one sector, it is possible to have a time period during which only one flash memory chip is working. For example, FIG. 13 shows a situation that only the flash memory chip 50 and the channel 1 are working for an ATA command 1. In this situation, functions provided by NCQ may be used to select a suitable ATA command 2 from the recorded information of the write commands and then request the host to provide the information of this ATA command 2. During the prior ATA command 1 is still transmitting data to the flash memory chip 50 or when the data transmission is completed but the flash memory chip 50 on the channel 1 is still busy, the two-channel flash controller 62 may work on the other channel for the ATA command 2, as shown in FIGS. 14 and 15. In another case, after the prior ATA command 1 has completed the data transmission to the flash memory chip 50 and the flash memory chip 50 is busy for the ATA command 1, the two-channel flash controller 62 may transmit data to the other flash memory chip 54 on the same channel 1 for the next ATA command 2, as shown in FIG. 16.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A writing method for a nonvolatile solid state storage device having a plurality of smallest erasable units, comprising the steps of:
    receiving a plurality of write commands, each write command containing a fewer number of bytes than contained in a smallest erasable unit of the nonvolatile solid state storage device;
    recording the plurality of write commands and information corresponding thereto;
    choosing a plurality of chosen write commands from the plurality of write commands according to the recorded information and a default choosing policy, wherein the plurality of the chosen write commands are to write data to the same smallest erasable unit of the nonvolatile solid state storage device; and
    executing the plurality of chosen write commands sequentially without intervening erase operations of the smallest erasable unit of the nonvolatile solid state storage device between consecutive write command executions of the sequence of chosen write commands.

2. The writing method of claim 1, wherein the step of receiving said plurality of write commands comprises the step of receiving the plurality of write commands by Native Command Queuing (NCQ).

3. The writing method of claim 1, wherein the information includes an indication of which at least one of the plurality of smallest erasable units of the nonvolatile solid state storage device is to be written by the plurality of write commands.

4. The writing method of claim 1, wherein the information includes a sequence in which the plurality of write commands are received.

5. The writing method of claim 1, wherein the information includes at least one Logical Block Address (LBA) to be written thereto by the plurality of write commands.

6. The writing method of claim 1, further comprising the steps of:
    receiving at least one additional write command to write to the same smallest erasable unit of the nonvolatile solid state storage device, during executing the chosen write commands; and
    executing said at least one additional write command in priority without an intervening erase operation once the chosen write commands are executed.

7. The writing method of claim 1, wherein the step of executing the plurality of chosen write commands is preceded by the step of copying data from the smallest erasable unit of the nonvolatile solid state storage device to a backup area, and subsequent to the sequential execution of all of the plurality of chosen write commands, copying the data in the backup area back to a residual area in the smallest erasable unit of the nonvolatile solid state storage device.

8. The writing method of claim 1, further comprising the step of selecting one from a plurality of choosing policies as the default choosing policy.

9. The writing method of claim 8, wherein the plurality of choosing policies comprise a largest fit policy, a smallest fit policy, a latest fit policy, an earliest fit policy, or a weight sort policy.

10. The writing method of claim 1, further comprising the step of replacing the default choosing policy with a new one selected from a plurality of choosing policies.

11. The writing method of claim 10, wherein the step of replacing the default choosing policy with a new one comprises the steps of:
    statistically monitoring a number of a plurality of executed write commands; and
    evaluating whether to update the default choosing policy when the number reaches a threshold.

12. The writing method of claim 11, wherein the step of evaluating whether to update the default choosing policy when the number reaches a threshold comprises the steps of:
    statistically obtaining a counting value of operation times from the information with which the plurality of write commands will operate the plurality of smallest erasable units of the nonvolatile solid state storage device according to each of the choosing policies;
    comparing the counting values belonging to the plurality of choosing policies for determining a best one among the plurality of choosing policies; and
    setting the best choosing policy as the default choosing policy if it is still not the default choosing policy.

13. The writing method of claim 12, wherein the counting value includes erasing counts to the plurality of smallest erasable units of the nonvolatile solid state storage device.

14. The writing method of claim 12, wherein the counting value includes backup counts for the plurality of smallest erasable units of the nonvolatile solid state storage device.

15. The writing method of claim 12, wherein the counting value includes copyback counts for the plurality of smallest erasable units of the nonvolatile solid state storage device.

16. A nonvolatile solid state storage device, comprising:
    a plurality of smallest erasable units, each smallest, erasable unit of the nonvolatile solid state storage device containing a greater number of bytes than contained in a single write command;
    an interface for receiving a plurality of write commands to write data to at least one of the plurality of smallest erasable units of the nonvolatile solid state storage device;
    a record unit connected to the interface, for recording the plurality of write commands and an information corresponding thereto;
    a choosing unit connected to the interface and the record unit for requeuing the plurality of write commands according to the information and a default choosing policy to establish one or more groups of write commands in accordance with which of the plurality of smallest erasable units of the nonvolatile solid state storage device the write commands correspond and determine an executive sequence of the one or more groups of write commands, wherein a chosen group of a multiplicity of write commands corresponding to the same smallest erasable unit of the nonvolatile solid state storage device are sequentially executed; and
    a controller unit connected to the choosing unit and the plurality of smallest erasable units of the nonvolatile solid state storage device for executing each group of write commands transferred from the choosing unit to write to the plurality of smallest erasable units of the nonvolatile solid state storage device, the controller unit sequentially executing the multiplicity of write commands of the chosen group thereof continuously without intervening erase operations of the smallest erasable unit of the nonvolatile solid state storage device to which the write commands correspond between consecutive executions of the write commands.

17. The nonvolatile solid state storage device of claim 16, wherein the interface is a Serial Advanced Technology Attachment (SATA) interface with Native Command Queuing (NCQ) supported.

18. The nonvolatile solid state storage device of claim 16, wherein the information includes an indication of which at least one of the plurality of smallest erasable units of the nonvolatile solid state storage device is to be written by the plurality of write commands.

19. The nonvolatile solid state storage device of claim 16, wherein the information includes a sequence in which the plurality of write commands are received by the interface.

20. The nonvolatile solid state storage device of claim 16, wherein the information includes at least one Logical Block Address (LBA.) to be written thereto by the plurality of write commands.

21. The nonvolatile solid state storage device of claim 16, wherein the controller further executes additional write commands in priority without an intervening erase operation after a plurality of chosen write commands are executed, wherein the additional write commands are received by the interface during execution of the chosen write commands and are to write to the same smallest erasable unit of the nonvolatile solid state storage device written by the chosen write commands.

22. The nonvolatile solid state storage device of claim 16, wherein the controller unit copies data in the smallest erasable unit of the nonvolatile solid state storage device to a backup area prior to sequential execution of all of the plurality of chosen write commands, and then copies the data in the backup area back to a residual area in the smallest erasable unit of the nonvolatile solid state storage device subsequent thereto.

23. The nonvolatile solid state storage device of claim 16, wherein the record unit comprises a memory for storing the information.

24. The nonvolatile solid state storage device of claim 16, wherein the choosing unit comprises a plurality of choosing policies and selects one therefrom as the default choosing policy.

25. The nonvolatile solid state storage device of claim 24, wherein the choosing unit comprises a learning mechanism for evaluating whether to update the default choosing policy after a number of the write commands that have been executed reaches a threshold.

26. The nonvolatile solid state storage device of claim 24, wherein the plurality of choosing policies comprise a largest fit policy, a smallest fit policy, a latest fit policy, an earliest fit policy, or a weight sort policy.

* * * * *